(12) United States Patent
Kim et al.

(10) Patent No.: US 12,111,365 B2
(45) Date of Patent: Oct. 8, 2024

(54) BATTERY APPARATUS AND METHOD FOR MEASURING CELL VOLTAGE

(71) Applicant: LG Energy Solution, Ltd., Seoul (KR)

(72) Inventors: Minwoo Kim, Daejeon (KR); Bo Hyun Seo, Daejeon (KR); Seunghyun Lee, Daejeon (KR); Tae Youn Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 170 days.

(21) Appl. No.: 17/790,258

(22) PCT Filed: Sep. 23, 2021

(86) PCT No.: PCT/KR2021/012929
§ 371 (c)(1),
(2) Date: Jun. 30, 2022

(87) PCT Pub. No.: WO2022/075636
PCT Pub. Date: Apr. 14, 2022

(65) Prior Publication Data
US 2023/0042107 A1 Feb. 9, 2023

(30) Foreign Application Priority Data

Oct. 6, 2020 (KR) .................. 10-2020-0128638

(51) Int. Cl.
*G01R 31/396* (2019.01)
*G01R 31/3835* (2019.01)

(52) U.S. Cl.
CPC ....... *G01R 31/396* (2019.01); *G01R 31/3835* (2019.01)

(58) Field of Classification Search
CPC .............. G01R 31/3835; G01R 31/388; G01R 19/16542; G01R 31/36; G01R 31/392; G01R 31/364; G01R 31/3842; G01R 31/367; G01R 31/382; G01R 19/00; G01R 31/385; G01R 31/3647; G01R 31/378; G01R 31/396; G01R 35/005; H02J 7/0048; H02J 7/00; H02J 7/0013; H02J 7/005;
(Continued)

(56) References Cited

U.S. PATENT DOCUMENTS 8,723,481 B2    5/2014  Zhang
9,400,312 B2 *  7/2016  Bosch .................. G01R 31/396
(Continued)

FOREIGN PATENT DOCUMENTS

JP    2014117068 A    6/2014
JP    2014157075 A    8/2014
(Continued)

OTHER PUBLICATIONS

International Search Report for Application No. PCT/KR2021/012929 mailed Jan. 7, 2022, pp. 1-4.
(Continued)

*Primary Examiner* — Vinh P Nguyen
(74) *Attorney, Agent, or Firm* — Lerner David LLP

(57) ABSTRACT

The first battery module and the second battery module are connected by a bus-bar. A cell voltage sensing circuit shared by at least some battery cells of the first battery module and at least some battery cells of the second battery module measures a voltage of each battery cell.

17 Claims, 10 Drawing Sheets

(58) Field of Classification Search
CPC ............ H02J 2310/48; H02J 7/007182; H02J 7/00304; H02J 7/00308; H02J 7/04; H02J 7/00036; H02J 7/0068; H01M 2010/4271; H01M 10/44; H01M 50/50; H01M 2220/00; H01M 10/625; H01M 10/4285; H01M 10/488; Y02E 60/10
See application file for complete search history.

(56) References Cited

U.S. PATENT DOCUMENTS

| | | | |
|---|---|---|---|
| 9,647,301 B2* | 5/2017 | Mizobe | H01M 10/482 |
| 11,346,886 B2* | 5/2022 | An | G01R 19/0084 |
| 11,411,259 B2* | 8/2022 | Machida | H02J 7/04 |
| 11,870,087 B2* | 1/2024 | Terauchi | H01M 10/0481 |
| 2014/0232413 A1 | 8/2014 | Kitahara et al. | |
| 2016/0233700 A1 | 8/2016 | Muto | |
| 2019/0187215 A1 | 6/2019 | Yoon et al. | |
| 2019/0260095 A1 | 8/2019 | Machida et al. | |
| 2020/0033412 A1 | 1/2020 | To et al. | |
| 2020/0119408 A1 | 4/2020 | Kim et al. | |

FOREIGN PATENT DOCUMENTS

| | | |
|---|---|---|
| JP | 2014186001 A | 10/2014 |
| JP | 2016146728 A | 8/2016 |
| JP | 6251136 B2 | 12/2017 |
| KR | 100471231 B1 | 3/2005 |
| KR | 20120059943 A | 6/2012 |
| KR | 101655377 B1 | 9/2016 |
| KR | 101856067 * | 5/2018 |
| KR | 101856067 B1 | 5/2018 |
| KR | 20190072764 A | 6/2019 |
| KR | 20190086967 * | 7/2019 |
| KR | 20190086967 A | 7/2019 |
| KR | 20200040533 A | 4/2020 |

OTHER PUBLICATIONS

Extended European Search Report issued in Appln. No. 201877888.4 mailed May 16, 2023 (7 pages).

* cited by examiner

BATTERY APPARATUS AND METHOD FOR MEASURING CELL VOLTAGE

CROSS-REFERENCE TO RELATED APPLICATIONS

The present application is a national phase entry under 35 U.S.C. § 371 of International Application No. PCT/KR2021/012929 filed Sep. 23, 2021, which claims priority from Korean Patent Application No. 10-2020-0128638 filed Oct. 6, 2020, all of which are incorporated herein by reference.

TECHNICAL FIELD

The described technology relates to a battery apparatus and a method for measuring a cell voltage.

BACKGROUND ART

An electric vehicle or a hybrid vehicle is a vehicle that obtains power by driving a motor mainly using a battery as a power supply. The electric vehicles are being actively researched because they are alternatives that can solve pollution and energy problems of internal combustion vehicles. Rechargeable batteries are used in various external apparatuses other than the electric vehicles.

Recently, as a battery having a high output and a large charging capacity is required, a battery pack in which a plurality of battery modules are connected in series is used. Since each battery module includes a plurality of battery cells, it is required to measure a voltage of the battery cell in order to diagnose the battery.

An integrated circuit (IC)-type cell voltage sensing circuit is used to measure the voltage of the battery cell. Currently, a separate cell voltage sensing IC is connected to each battery module. For example, one or more cell voltage sensing ICs are connected to one battery module, and one or more separate cell voltage sensing ICs are connected to another battery module. Accordingly, as the number of battery modules included in the battery pack increases, the number of required cell voltage sensing ICs increases, and thus the cost of the battery may increase.

SUMMARY

Technical Problem

In some embodiments, a battery apparatus and a method for measuring a cell voltage for optimizing a cell voltage sensing circuit may be provided.

Technical Solution

According to an embodiment, a battery apparatus may be provided. The battery apparatus may include a first battery module including a first plurality of battery cells, a second battery module including a second plurality of battery cells, a bus-bar connecting a first electrode terminal of the first battery module and a second electrode terminal of the second battery module, a cell voltage sensing circuit, and a processor. The cell voltage sensing circuit may be shared by a first portion of battery cells included in the first plurality of battery cells and a second portion of battery cells included in the second plurality of battery cells, and may be configured to measure a voltage of each battery cell included in the first and second portions of battery cells and a voltage of the bus-bar. The processor may be configured to correct a voltage of at least one battery cell among the first and second portions of battery cells based on the voltage of the bus-bar.

In some embodiments, the processor may be configured to correct the voltage of the at least one battery cell by subtracting the voltage of the bus-bar from the voltage of the at least one battery cell measured by the cell voltage sensing circuit.

In some embodiments, the first electrode terminal may be a negative terminal of the first battery module, and the at least one battery cell may be among the first portion of battery cells and connected to the negative terminal.

In some embodiments, the second electrode terminal may be a positive terminal of the second battery module, and the at least one battery cell may be among the second portion of battery cells and connected to the positive terminal.

In some embodiments, the cell voltage sensing circuit may be provided in a form of an integrated circuit (IC) including a plurality of pins. The first plurality of battery cells may include a first battery cell connected to the first electrode terminal, and the second plurality of battery cells may include a second battery cell connected to the second electrode terminal. In this case, a first contact between the first electrode terminal and the first battery cell may be connected to a first pin of the plurality of pins of the bus-bar, and a second contact between the second electrode terminal and the second battery cell may be connected to a second pin of the plurality of pins of the bus-bar. The second may be connected to a third pin of the plurality of pins of the bus-bar for battery cell voltage sensing.

In some embodiments, the at least one battery cell may include the first battery cell.

In some embodiments, the first electrode terminal may be a negative terminal of the first battery module, and the second electrode terminal may be a positive terminal of the second battery module. In this case, the first contact may be a negative electrode of the first battery cell, and the second contact may be a positive electrode of the second battery cell.

In some embodiments, the first electrode terminal may be a positive terminal of the first battery module, and the second electrode terminal may be a negative terminal of the second battery module. In this case, the first contact may be a positive electrode of the first battery cell, and the second contact may be a negative electrode of the second battery cell.

According to another embodiment, a method of measuring a cell voltage of a battery apparatus including a first battery module and a second battery module, the first battery module including a first plurality of battery cells, the second battery module including a second plurality of battery cells, may be provided. The method may include measuring, by a cell voltage sensing circuit shared by a first portion of battery cells included in the first plurality of battery cells and a second portion of battery cells included in the second plurality of battery cells, a voltage of each battery cell included in the first and second portions of battery cells, measuring, by the cell voltage sensing circuit, a voltage of a bus-bar connecting the first battery module and the second battery module, and correcting, by a processor, a voltage of at least one battery cell among the first and second portions of battery cells based on the voltage of the bus-bar.

In some embodiments, correcting the voltage of the at least one battery cell may include correcting the voltage of the at least one battery cell by subtracting the voltage of the bus-bar from the voltage of the at least one battery cell measured by the cell voltage sensing circuit.

In some embodiments, the at least one battery cell for which the voltage is corrected by the processor may be a battery cell sharing the cell voltage sensing circuit and connected to the bus-bar.

According to yet another embodiment, a battery apparatus may be provided. The battery apparatus may include a plurality of battery modules including a first battery module and a second battery module, a bus-bar connecting the first battery module and the second battery module, and a cell voltage sensing circuit shared by a first plurality of battery cells of the first battery module and a second plurality of battery cells of the second battery module, and configured to measure a voltage of each of the first plurality of battery cells and the second plurality of battery cells.

In some embodiments, the cell voltage sensing circuit may include a plurality of pins. A first battery cell included in the first plurality of battery cells may be connected to the bus-bar, a second battery cell included in the second plurality of battery cells may be connected to the bus-bar, a negative electrode of the first battery cell may be connected to a first pin of the plurality of pins, and a positive electrode of the second battery cell may be connected to a second pin of plurality of pins. A positive electrode of the first battery cell may be connected to a third pin of the plurality of pins, the positive electrode of the second battery cell may be connected to a fourth pin of the plurality of pins, and the third and fourth pins may be for battery cell voltage sensing.

In this case, the processor may measure a voltage of the first battery cell by correcting a voltage between the third pin and the fourth pin based on a voltage between the first pin and the second pin.

In some embodiments, the cell voltage sensing circuit may include a plurality of pins. A first battery cell included in the first plurality of battery cells may be connected to the bus-bar, a second battery cell included in the second plurality of battery cells may be connected to the bus bar, a negative electrode of the first battery cell may be connected to a first pin of the plurality of pins, and a positive electrode of the second battery cell may be connected to a second pin of the plurality of pins. The negative electrode of the first battery cell may be connected to a third pin of the plurality of pins, the negative electrode of the second battery cell may be connected to a fourth pin of the plurality of pins, and the third and fourth pins may be for battery cell voltage sensing.

In this case, the processor may measure a voltage of the second battery cell by correcting a voltage between the third pin and the fourth pin based on a voltage between the first pin and the second pin.

In some embodiments, the second plurality of battery cells may be a subset of battery cells included in the second battery module, and the plurality of battery modules may further include a third battery module. In this case, the battery apparatus may further include a second bus-bar connecting the second battery module and the third battery module, and a second cell voltage sensing circuit shared by battery cells of the second battery module not included in the second plurality of battery cells and a third plurality of battery cells included in the third battery module.

Advantageous Effects

According to some embodiments, the number of cell voltage sensing circuits connected to the plurality of battery modules may be reduced. According to another embodiment, the voltage of the bus-bar included in the measured voltage of the battery cell may be compensated.

DETAILED DESCRIPTION

Figure 1:
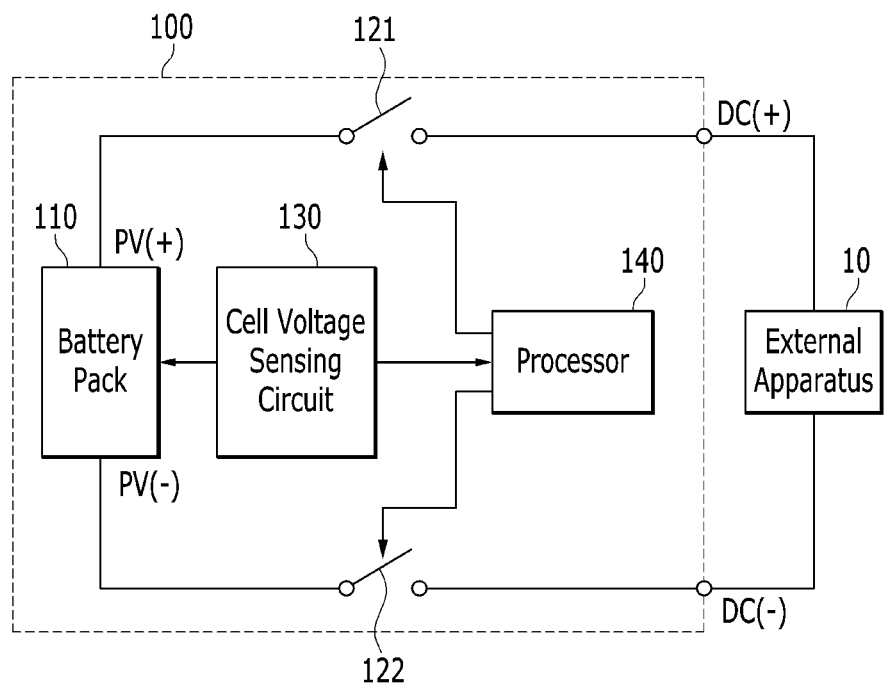
FIG. 1 is a diagram showing a battery apparatus according to an embodiment.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

FIG. 1 is a diagram showing a battery apparatus according to an embodiment.

Referring to FIG. 1, a battery apparatus 100 has a structure that can be electrically connected to an external apparatus 10 through a positive link terminal DC(+) and a negative link terminal DC(−). In some embodiments, the battery apparatus 100 may be connected to the external apparatus 10 through the positive link terminal DC(+) and the negative link terminal DC(−). When the external apparatus is a load, the battery apparatus 100 is discharged by operating as a power supply that supplies power to the load. The external apparatus operating as the load may be, for example, an electronic device, a mobility apparatus, or an energy storage system (ESS). The mobility apparatus may be, for example, a vehicle such as an electric vehicle, a hybrid vehicle, or a smart mobility.

The battery apparatus 100 includes a battery pack 110, a positive main switch 121, a negative main switch 122, a cell voltage sensing circuit 130, and a processor 140.

The battery pack 110 has a positive terminal PV(+) and a negative terminal PV(−). The battery pack includes a plurality of battery modules (not shown) connected in series between the positive terminal PV(+) and the negative terminal PV(−), and each battery module includes a plurality of battery cells (not shown). In some embodiments, the plurality of battery cells in each battery module may be connected in series. In some embodiments, the battery cell may be a rechargeable cell. In this way, the plurality of battery modules may be connected in the battery pack 110 to supply desired power.

The positive main switch 121 is connected between the positive terminal PV(+) of the battery pack 110 and the positive link terminal DC(+) of the battery apparatus 100. The negative main switch 122 is connected between the negative terminal PV(−) of the battery pack 110 and the negative link terminal DC(−) of the battery apparatus 100. The switches 121 and 122 may be controlled by the processor 140 to control an electrical connection between the battery pack 110 and the external apparatus. That is, the switches 121 and 122 may control supply of a current of the battery pack 110. In one embodiment, each of the switches 121 and 122 may be a contactor implemented in a relay. In another embodiment, each of the switches 121 and 122 may be an electrical switch such as a transistor. In some embodiments, the battery apparatus 100 may further include driving circuits (not shown) for controlling the switches 121 and 122, respectively.

The cell voltage sensing circuit 130 measures voltages of battery cells of the battery pack 110. In some embodiments, the cell voltage sensing circuit 130 may measure the voltage of the battery cell by sensing voltages at positive and negative electrodes of the battery cell. The processor 140 manages the battery apparatus 100 based on the voltages measured by the cell voltage sensing circuit 130. In some embodiments, the processor 140 may control operations of the switches 121 and 122. The processor 140 may be, for example, a micro controller unit (MCU).

The processor 140 may form a battery management system. In some embodiments, the battery management system may further include a cell voltage sensing circuit 130.

Figure 2:
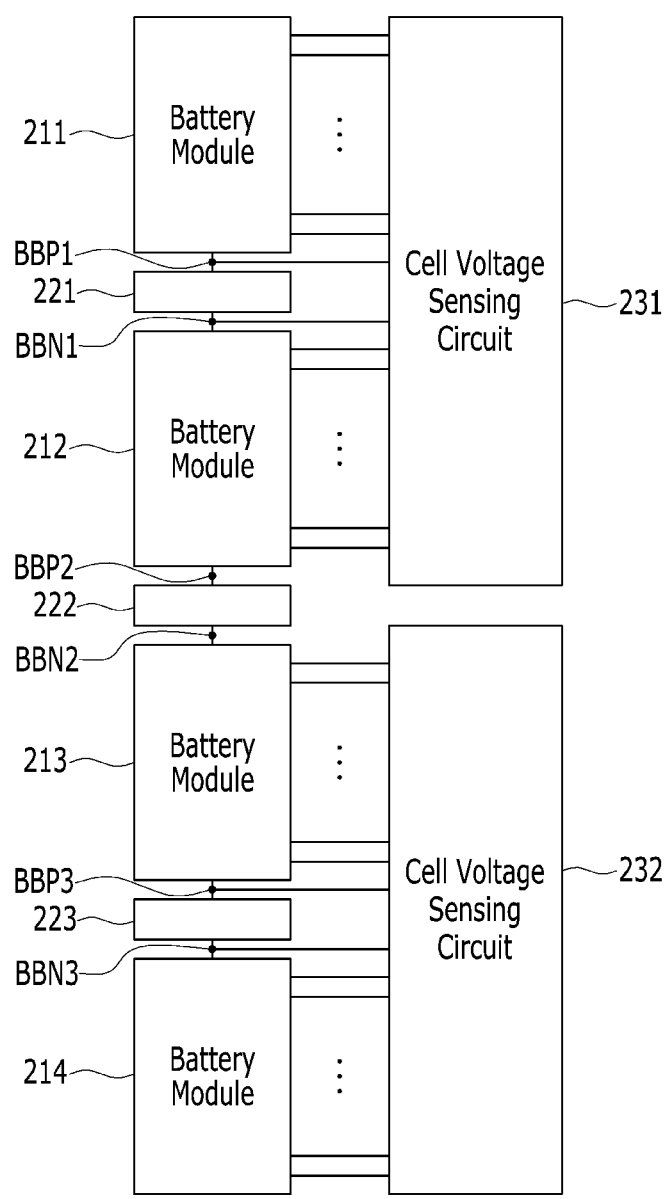
FIG. 2, FIG. 3, and FIG. 4 are diagrams showing a connection relationship between a battery module and a cell voltage sensing circuit in a battery apparatus according to various embodiments.
Figure 3:
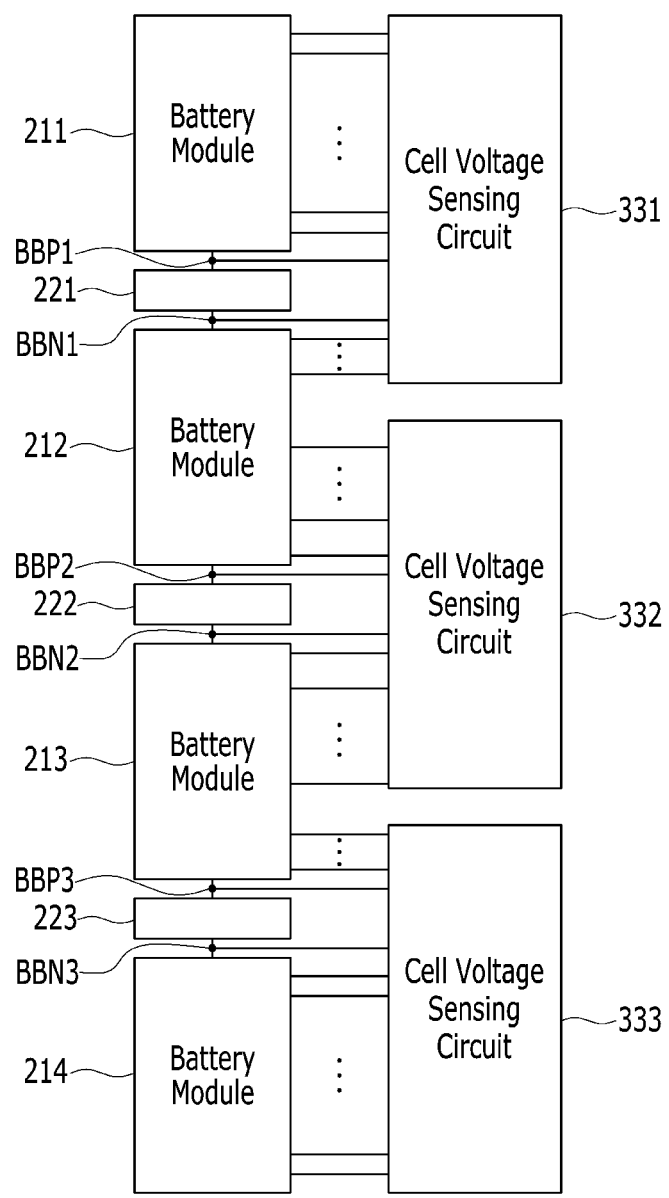
Figure 4:
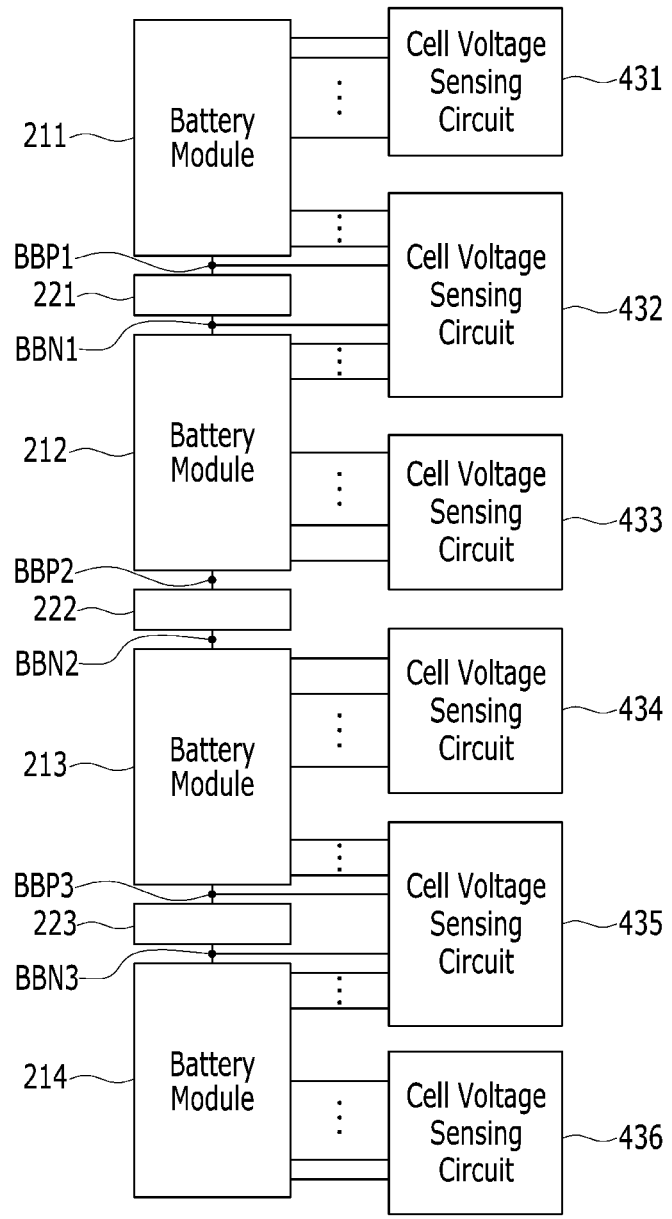
Figure 5:
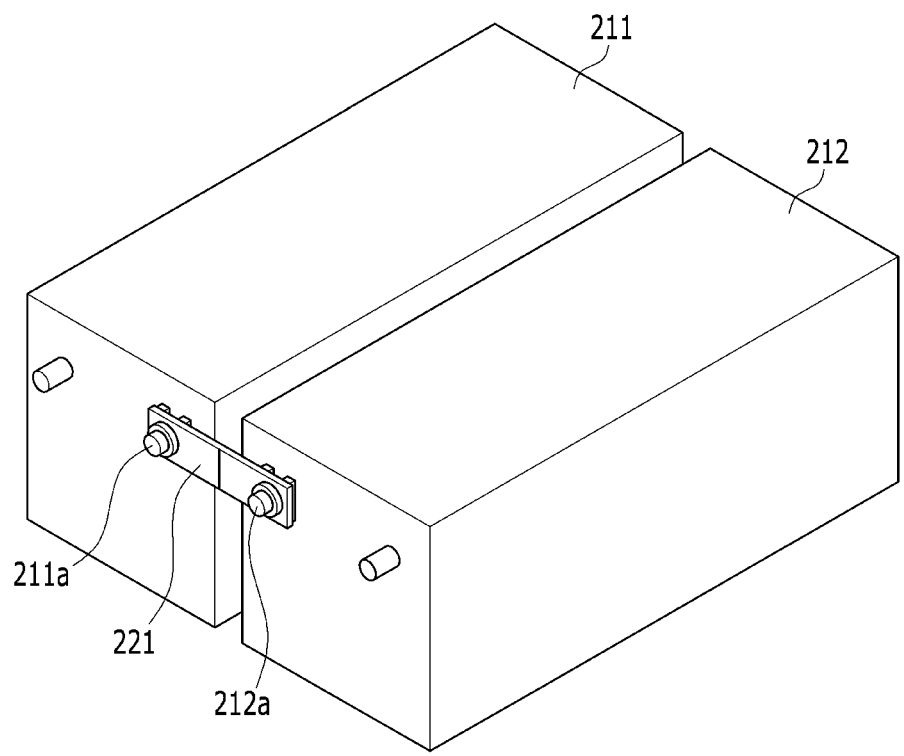
FIG. 5 is a drawing showing an example of a bus-bar in a battery apparatus according to an embodiment.

FIG. 2, FIG. 3, and FIG. 4 are diagrams showing a connection relationship between a battery module and a cell voltage sensing circuit in a battery apparatus according to various embodiments, and FIG. 5 is a drawing showing an example of a bus-bar in a battery apparatus according to an embodiment.

Referring to FIG. 2, FIG. 3, and FIG. 4, in a battery pack, a plurality of battery modules 211, 212, 213, and 214 are connected in series. Although FIG. 2, FIG. 3, and FIG. 4 show four battery modules 211, 212, 213, and 214 for convenience of description, the number of battery modules is not limited thereto.

Two adjacent battery modules are connected via a bus-bar. A bus-bar 221 connects the battery module 211 and the battery module 212, a bus-bar 222 connects the battery module 212 and the battery module 213, and a bus-bar 223 connects the battery module 213 and the battery module 214. A first terminal of the bus-bar 221 may be connected to a node BBP1 corresponding to a negative terminal of the battery module 211, and a second terminal of the bus-bar 221 may be connected to a node BBN1 corresponding to a positive terminal of the battery module 212. Further, a first terminal of the bus-bar 222 may be connected to a node BBP2 corresponding to a negative terminal of the battery module 212, and a second terminal of the bus-bar 222 may be connected to a node BBN2 corresponding to a positive terminal of the battery module 213. Furthermore, a first terminal of the bus-bar 223 may be connected to a node BBP3 corresponding to a negative terminal of the battery module 213, and a second terminal of the bus-bar 223 may be connected to a node BBN3 corresponding to a positive terminal of the battery module 214. In some embodiments, the positive terminal of each battery module may be connected to a positive electrode of the last battery cell among a plurality of battery cells, which are included in the corresponding battery module and are connected in series, and the negative terminal of each battery module may be connected to a negative electrode of the first battery cell among the plurality of battery cells, which are included in the corresponding battery module and are connected in series.

In some embodiments, the bus-bars 221, 222, and 223 may be formed of a material having electrical conductivity. The bus-bars 221, 222, and 223 may be formed in various shapes according to a structure of the battery pack 210 or the battery modules 211, 212, 213 and 214. For example, as shown in FIG. 5, the bus-bar 221 may be connected with an electrode terminal 211a of one battery module 211 and an electrode terminal 212a of the other battery module 212 so as to connect the battery module 211 and the battery module 212. The electrode terminal 211a of the battery module 211 may be a negative terminal of the battery module 211, and the electrode terminal 212a of the battery module 212 may be a positive terminal of the battery module 212.

In some embodiments, as shown in FIG. 2 and FIG. 3, a cell voltage sensing circuit may be connected to two or more battery modules. In this case, the number of battery cells that can be sensed by the cell voltage sensing circuit may be greater than the number of battery cells included in one battery module. In some embodiments, when the cell voltage sensing circuit is provided as an integrated circuit (IC), the number of cell voltage sensing pins (or channels) in the cell voltage sensing IC may be greater than the number of battery cells included in one battery module.

Referring to FIG. 2, a cell voltage sensing circuit 231 may be connected to a plurality of battery cells of battery modules 211 and 212 to measure a voltage of each of the battery cells, and the cell voltage sensing circuit 232 may be connected to a plurality of battery cells of battery module 213 and 214 to measure a voltage of each of the battery cells. In some embodiments, the cell voltage sensing circuit 231 may be connected to the plurality of battery cells of the battery module 211 and the plurality of battery cells of the battery module 212 through a plurality of sensing lines, and the cell voltage sensing circuit 232 may be connected to the plurality of battery cells of the battery module 213 and the plurality of battery cells of the battery module 214 through a plurality of sensing lines. The cell voltage sensing circuits 231 and 232 may sense voltages at the positive and negative electrodes of each battery cell and measure a voltage between the positive and negative electrodes as a voltage of the corresponding battery cell. In this case, a sensing line connected to a positive electrode of a certain battery cell to sense the positive electrode may be also connected to a negative electrode of an adjacent battery cell, and a sensing line connected to a negative electrode of a certain battery cell to sense the negative electrode may be also connected to a positive electrode of another adjacent battery cell.

Further, the cell voltage sensing circuit 231 may measure a voltage of a bus-bar 221 connecting the two battery modules 211 and 212, and the cell voltage sensing circuit 232 may measure a voltage of a bus-bar 223 connecting the two battery modules 213 and 214. The cell voltage sensing circuit 231 may measure a voltage between both terminals of the bus-bar 221, i.e., a voltage between the two nodes BBP1 and BBN1, as the voltage of the bus-bar 221, and the cell voltage sensing circuit 232. may measure a voltage between both terminals of the bus-bar 223, i.e., a voltage between the two nodes BBP3 and BBN3, as the voltage of the bus-bar 223.

In some embodiments, each of the cell voltage sensing circuits 231 and 232 may be provided as a cell voltage sensing IC. In some embodiments, the cell voltage sensing IC 231 may include a plurality of pins respectively connected to a plurality of battery cells of the battery modules 211 and 212 and two pins respectively connected to both terminals BBP1 and BBN1 of the bus-bar 221. Further, the cell voltage sensing IC 232 may include a plurality of pins respectively connected to a plurality of battery cells of the battery modules 213 and 214 and two pins respectively connected to both terminals BBP3 and BBN3 of the bus-bar 223. In this case, the cell voltage sensing IC may measure the voltage of the bus-bar through two pins respectively connected to both terminals of the bus-bar, and measure the voltage of the battery cell through the pins connected to the battery cell.

Referring to FIG. 3, in some embodiments, a cell voltage sensing circuit 331 may be connected to a plurality of battery cells of a battery module 211 and some battery cells of a battery module 212 to measure a voltage of each of the battery cells. The cell voltage sensing circuit 332 may be connected to remaining battery cells of the battery module 212 and some battery cells of a battery module 213 to measure a voltage of each of the battery cells. The cell voltage sensing circuit 333 may be connected to remaining battery cells of the battery module 213 and a plurality of battery cells of a battery module 214 to measure a voltage of each of the battery cells.

Further, the cell voltage sensing circuit 331 may measure a voltage of a bus-bar 221 connecting the two battery modules 211 and 212, the cell voltage sensing circuit 332 may measure a voltage of a bus-bar 222 connecting the two battery modules 212 and 213, and the cell voltage sensing circuit 333 may measure a voltage of a bus-bar 223 connecting the two battery modules 213 and 214.

According to the above-described embodiments, since the cell voltage sensing circuit is connected to two or more battery modules, the number of cell voltage sensing circuits required for the battery apparatus can be reduced, thereby reducing the cost of the battery apparatus. In examples shown in FIG. 2 and FIG. 3, although four cell voltage sensing circuits are required when a separate cell voltage sensing circuit is used for each battery module, two or three cell voltage sensing circuits can be used according to the above-described embodiments.

In some embodiments, as shown in FIG. 4, two cell voltage sensing circuits may be connected to one battery module. In this case, the number of battery cells that can be sensed by the cell voltage sensing circuit may be less than the number of battery cells included in one battery module. In some embodiments, when the cell voltage sensing circuit is provided as a cell voltage sensing IC, the number of pins (or channels) of the cell voltage sensing IC may be less than the number of battery cells included in one battery module.

Referring to FIG. 4, a cell voltage sensing circuit 431 may be connected to some battery cells of a battery module 211 to measure a voltage of each of the battery cells, a cell voltage sensing circuit 432 may be connected to remaining battery cells of the battery module 211 and some battery cells of a battery module 212 to measure a voltage of each of the battery cells, and a cell voltage sensing circuit 433 may be connected to remaining battery cells of the battery module 212 to measure a voltage of each of the battery cells. Further, a cell voltage sensing circuit 434 may be connected to some battery cells of a battery module 213 to measure a voltage of each of the battery cells, a cell voltage sensing circuit 435 may be connected to remaining battery cells of the battery module 213 and some battery cells of a battery module 214 to measure a voltage of each of the battery cells, and a cell voltage sensing circuit 436 may be connected to remaining battery cells of the battery module 214 to measure a voltage of each of the battery cells.

Furthermore, a cell voltage sensing circuit 432 may measures a voltage of a bus-bar 221 connecting the two battery modules 211 and 212, and a cell voltage sensing circuit 434 may measure a voltage of a bus-bar 223 connecting the two battery modules 212 and 213.

According to the above-described embodiments, since the cell voltage sensing circuit is connected to two or more battery modules, the number of cell voltage sensing circuits required for the battery apparatus can be reduced, thereby reducing the cost of the battery apparatus. In the example shown in FIG. 4, although eight cell voltage sensing circuits are required when a separate cell voltage sensing circuit is used for each battery module, six cell voltage sensing circuits can be used according to the above-described embodiments.

Next, a voltage measurement of a battery cell is described with reference to FIG. 6 to FIG. 9.

FIG. 6, FIG. 7, FIG. 8, and FIG. 9 are diagrams for explaining a voltage measurement of a battery cell in a battery apparatus according to various embodiments. FIG. 6, FIG. 7, FIG. 8, and FIG. 9 shows only battery cells around a bus-bar among battery cells of a battery module for convenience of description.

First, embodiments in which two battery modules connected to a bus-bar are connected to different cell voltage sensing circuits are described with reference to FIG. 6 and FIG. 7. For example, as shown in FIG. 2, battery modules 212 and 213 may be connected to the cell voltage sensing circuits 231 and 232, respectively. Alternatively, as shown in FIG. 4, battery modules 212 and 213 may be connected to cell voltage sensing circuits 433 and 434, respectively.

Figure 6:
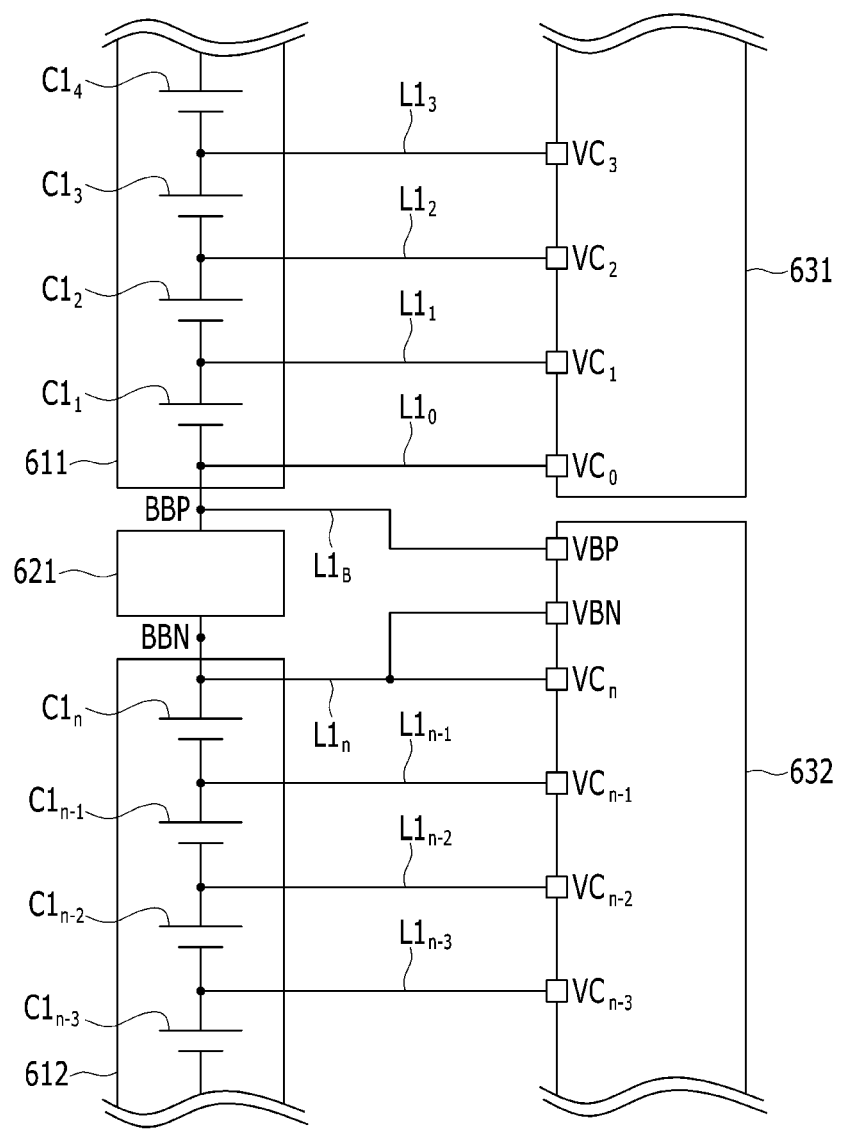
FIG. 6, FIG. 7, FIG. 8, and FIG. 9 are diagrams for explaining a voltage measurement of a battery cell in a battery apparatus according to various embodiments.
Figure 7:
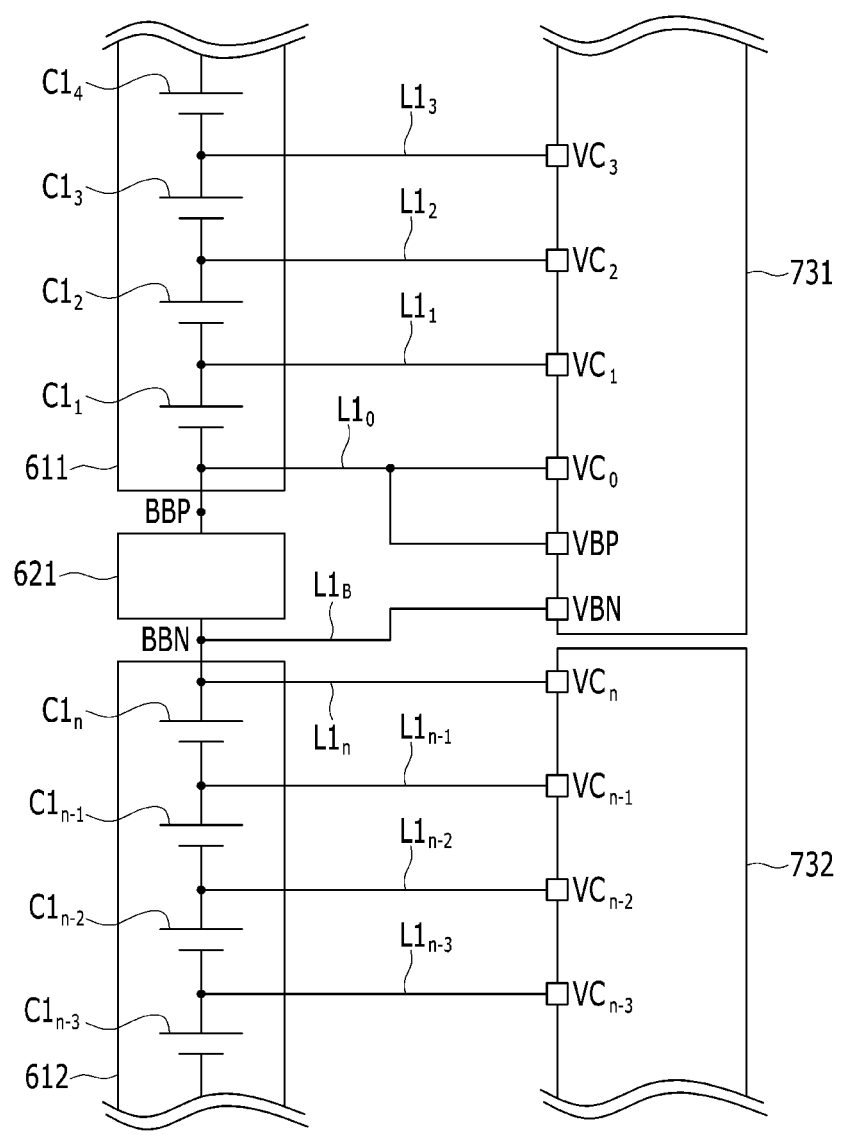

Referring to FIG. 6, a separate cell voltage sensing circuit may be connected to each battery module. That is, a cell voltage sensing circuit 631 may be connected to a battery module 611, and a cell voltage sensing circuit 632 may be connected to a battery module 612. When the number of battery cells that can be sensed by the cell voltage sensing circuit 631 or 632 is less than the number of battery cells included in the battery module 611 or 612 (e.g., a case of FIG. 4), another cell voltage sensing circuit may be additionally connected to each battery module 611 or 612. The two battery modules 611 and 612 may be connected by a bus-bar 621.

A plurality of sensing lines of the cell voltage sensing circuit 631 are connected to a plurality of battery cells of the battery module 611. In order to measure a voltage of a battery cell, one sensing line is connected to a contact of two adjacent battery cells, i.e., a negative electrode of one battery cell and a positive electrode of another battery cell. In the battery module 611, a contact of two battery cells $C1_1$ and $C1_2$, i.e., a positive electrode of the battery cell $C1_1$ and a negative electrode of the battery cell $C1_2$ are connected to a sensing line $L1_1$, a contact of two battery cells $C1_2$ and $C1_3$, i.e., a positive electrode of the battery cell $C1_2$ and a negative electrode of the battery cell $C1_3$ are connected to a sensing line $L1_2$, and a contact of two battery cells $C1_3$ and $C1_4$, i.e., a positive electrode of the battery cell $C1_3$ and a negative electrode of the battery cell $C1_4$ are connected to a sensing line $L1_3$. In addition, a negative electrode of the battery cell $C1_1$ is connected to a sensing line $L1_0$. In some embodiments, the sensing lines $L1_0$, $L1_1$, $L1_2$, and $L1_3$ may be connected to a plurality of pins $VC_0$, $VC_1$, $VC_2$, and $VC_3$ for cell voltage sensing in the cell voltage sensing circuit 631, respectively.

Accordingly, the cell voltage sensing circuit 631 may measure a voltage of each battery cell based on a voltage difference between two adjacent corresponding sensing lines among the plurality of sensing lines $L1_0$, $L1_1$, $L1_2$, and $L1_3$. That is, the cell voltage sensing circuit 631 may measure, as the voltage of each battery cell, a voltage between a positive electrode of the corresponding battery cell and a positive electrode of an adjacent battery cell. In some embodiments, the cell voltage sensing circuit 631 may measure a voltage of each battery cell based on a voltage difference between two adjacent corresponding pins among the plurality of pins. For example, the cell voltage sensing circuit 631 may measure the voltage of the battery cell $C1_i$ based on the voltage difference between the two sensing lines $L1_{i-1}$ and $L1_i$ (i.e., the voltage difference between the two pins $VC_{i-1}$ and $VC_i$, wherein i is an integer greater than or equal to one (1).

A plurality of sensing lines of the cell voltage sensing circuit 632 are connected to a plurality of battery cells of the battery module 612 and the bus-bar 621. In the battery module 612, a contact of two battery cells $C1_{n-1}$ and $C1_n$, i.e., a positive electrode of the battery cell $C1_{n-1}$ and a negative electrode of the battery cell $C1_n$ are connected to a sensing line $L1_{n-1}$, a contact of two battery cells $C1_{n-2}$ and $C1_{n-1}$, i.e., a positive electrode of the battery cell $C1_{n-2}$ and a negative electrode of the battery cell $C1_{n-1}$ are connected to a sensing line $L1_{n-2}$, and a contact of two battery cells $C1_{n-3}$ and $C1_{n-2}$, i.e., a positive electrode of the battery cell $C1_{n-3}$ and a negative electrode of the battery cell $C1_{n-2}$ are connected to a sensing line $L1_{n-3}$. Further, a positive electrode of the battery cell $C1_n$ is connected to a sensing line $L1_n$, and a second terminal BBN of the bus-bar 621 is connected to the sensing line $L1_n$ through the positive electrode of the battery cell $C1_n$. Furthermore, a first terminal BBP of the bus-bar 621 is connected to a sensing line $L1_B$.

In some embodiments, the plurality of sensing lines $L1_{n-3}$, $L1_{n-2}$, $L1_{n-1}$, and $L1_n$ may be connected to a plurality of pins $VC_{n-3}$, $VC_{n-2}$, $V_{n-1}$, and $VC_n$ for cell voltage sensing in the cell voltage sensing circuit 632, respectively. Further, the sensing line $L1_n$ may be connected to a pin VBN for the bus-bar 621 in the cell voltage sensing circuit 632 as well as the pin $VC_n$. Furthermore, the sensing line $L1_B$ may be connected to another pin VBP for the bus-bar 621 in the cell voltage sensing circuit 632.

Accordingly, the cell voltage sensing circuit 632 may measure a voltage of each battery cell based on a voltage difference between two adjacent corresponding sensing lines among the plurality of sensing lines $L1_{n-3}$, $L1_{n-2}$, $L1_{n-1}$, and $L1_n$. That is, the cell voltage sensing circuit 632 may measure, as the voltage of each battery cell, a voltage between a positive electrode of the corresponding battery cell and a positive electrode of an adjacent battery cell. In some embodiments, the cell voltage sensing circuit 632 may measure the voltage of each battery cell based on a voltage difference between two adjacent corresponding pins among the plurality of pins $V_{n-3}$, $VC_{n-2}$, $VC_{n-1}$, and $VC_1$. Further, the cell voltage sensing circuit 632 may measure the voltage of the bus-bar 621, i.e., a voltage between both terminals of the bus-bar 621 based on a voltage difference between the two sensing lines $L1_n$ and $L1_B$ (i.e., a voltage difference between the two pins VBP and VBN).

In some other embodiments, unlike the embodiment described with reference to FIG. 6, the cell voltage sensing circuits 631 and 632 may measure, as the voltage of each battery cell, a voltage between a negative electrode of the corresponding battery cell and a negative electrode of an adjacent battery cell. In this case, the voltage of the bus-bar 621 may be measured by the cell voltage sensing circuit 631. As shown in FIG. 7, a first terminal BBP of the bus-bar 621 may be connected to a sensing line $L1_0$ through the negative electrode of the battery cell $C1_1$ of the battery module 611. Further, a second terminal BBN of the bus-bar 621 may be connected to a sensing line $L1_B$. In some embodiments, the sensing line $L1_0$ may be connected to a pin VBP for the bus-bar 621 in the cell voltage sensing circuit 731 as well as a pin $VC_0$. Furthermore, the sensing line $L1_B$ may be connected to another pin VBN for the bus-bar 621 in the cell voltage sensing circuit 732. Accordingly, the cell voltage sensing circuit 731 may measure the voltage of the bus-bar 621 based on a voltage difference between the two sensing lines $L1_0$ and $L1_B$ (i.e., a voltage difference between the two pins VBP and VBN).

Next, embodiments in which two battery modules connected to a bus-bar are connected to the same cell voltage sensing circuit are described with reference to FIG. 8 and FIG. 9. For example, as shown in FIG. 2, FIG. 3, and FIG. 4, the battery modules 211 and 212 may be connected to the cell voltage sensing circuit 231, 331 or 432, or the battery modules 213 and 214 may be connected to the cell voltage sensing circuit 232, 333 or 435. Alternatively, as shown in FIG. 3, the battery modules 212 and 213 may be connected to the cell voltage sensing circuit 332.

Figure 8:
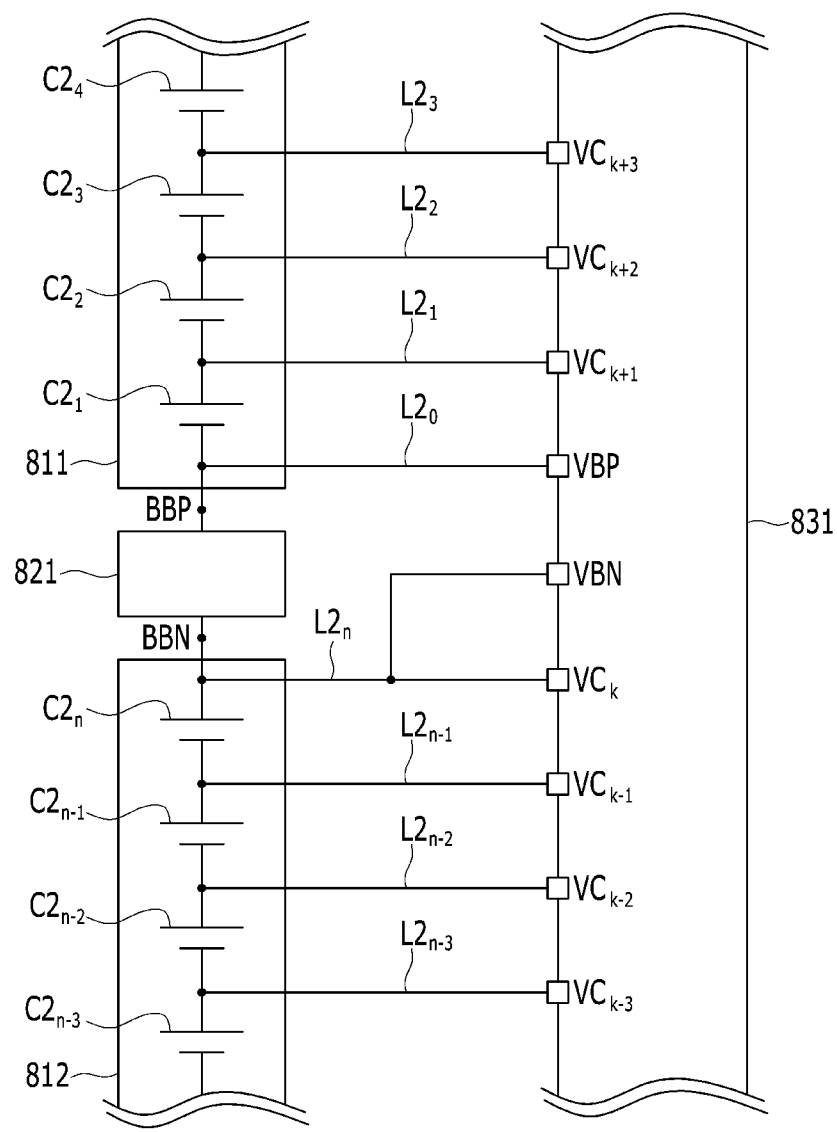
Figure 9:
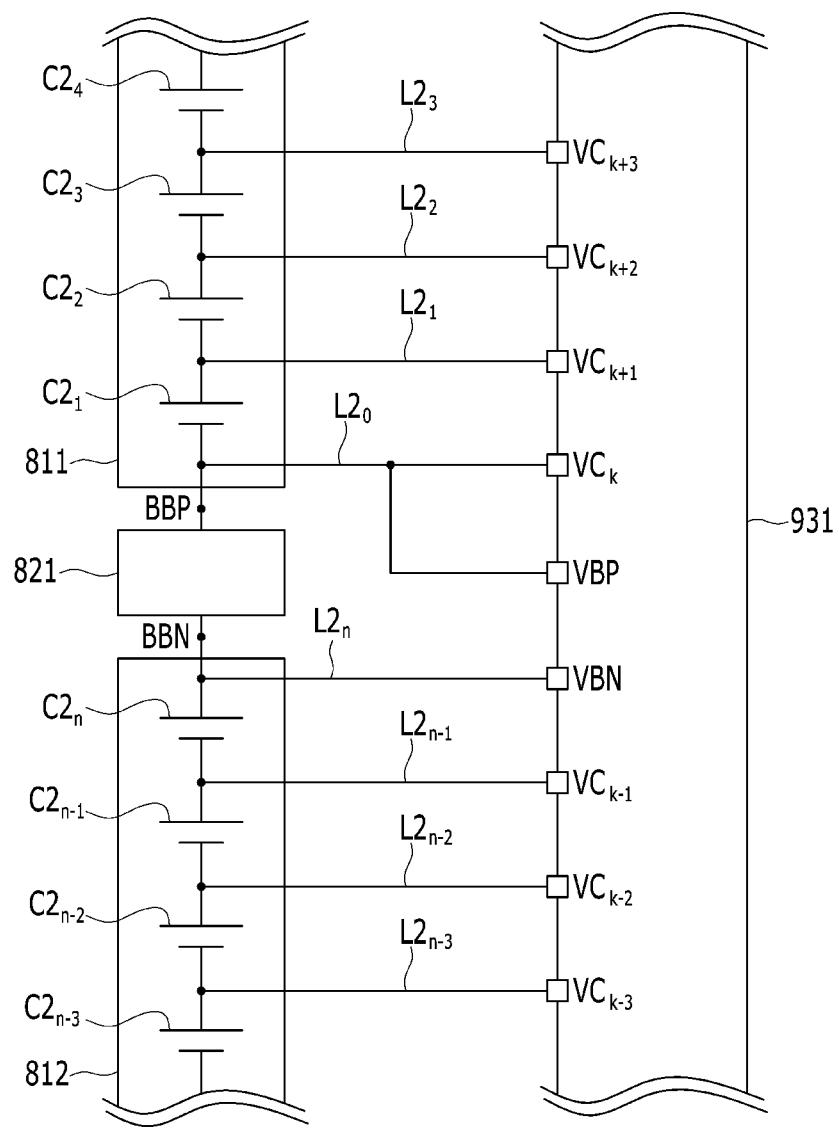

Referring to FIG. 8, a cell voltage sensing circuit 831 is connected to battery modules 811 and 812 and a bus-bar 821 connecting the two battery modules 811 and 812 to measure a voltage of each of the battery cells and a voltage of the bus-bar 821. As described with reference to FIG. 2, FIG. 3, and FIG. 4, the cell voltage sensing circuit 831 may be connected to some battery cells of the battery module 811 or 812 or to all battery cells of the battery module 811.

A plurality of sensing lines of the cell voltage sensing circuit 831 are connected to a plurality of battery cells of the battery modules 811 and 812, and a bus-bar 821, respectively. In order to measure a voltage of a battery cell, one sensing line is connected to a contact of two adjacent battery cells, i.e., a negative electrode of one battery cell and a positive electrode of another battery cell. In the battery module 811, a contact of two battery cells $C2_1$ and $C2_2$, i.e., a positive electrode of the battery cell $C2_1$ and a negative electrode of the battery cell $C2_2$ is connected to a sensing line $L2_1$, a contact of two battery cells $C2_2$ and $C2_3$, i.e., a positive electrode of the battery cell $C2_2$ and a negative electrode of the battery cell $C2_3$ are connected to a sensing line $L2_2$, and a contact of two battery cells $C2_3$ and $C2_4$, i.e., a positive electrode of the battery cell $C2_3$ and a negative electrode of the battery cell $C2_4$ are connected to a sensing line $L2_3$. Further, in the battery module 812, a contact of two battery cells $C2_{n-1}$ and $C2_{n-1}$, i.e., a positive electrode of the battery cell $C2_{n-1}$ and a negative electrode of the battery cell $C2_n$ are connected to a sensing line $L2_{n-1}$, a contact of two battery cells $C2_{n-2}$ and i.e., a positive electrode of the battery cell $C2_{n-2}$ and a negative electrode of the battery cell $C2_{n-1}$ are connected to a sensing line $L2_{n-2}$, and a contact of two battery cells $C2_{n-3}$ and $C2_{n-2}$, i.e., a positive electrode of the battery cell $C2_{n-3}$ and a negative electrode of the battery cell $C2_{n-2}$ are connected to a sensing line $L2_{n-3}$.

Because of the bus-bar 821, the negative electrode of the first battery cell $C2_1$ of the battery module 811 and a positive electrode of a battery cell adjacent to the battery cell $C2_1$, i.e., the last battery cell $C2_n$ of the battery module 812 cannot be connected to the same sensing line. Accordingly, the negative electrode of the first battery cell $C2_1$ of the battery module 811 is connected to a sensing line $L2_0$, and the positive electrode of the last battery cell $C2_n$ of the battery module 812 is connected to a sensing line $L2_n$. Since a first terminal BBP of the bus-bar 821 is connected to the negative electrode of the battery cell $C2_1$ which is a negative terminal of the battery module 811, the first terminal BBP of the bus-bar 821 is connected to the sensing line $L2_0$ through the negative electrode of the battery cell $C2_1$. Further, since a second terminal BBN of the bus-bar 821 is connected to the positive electrode of the battery cell $C2_n$ which is a positive terminal of the battery module 812, the second terminal BBN of the bus-bar 821 is connected to the sensing line $L2_n$ through the positive electrode of the battery cell $C2_n$.

In some embodiments, the plurality of sensing lines $L2_3$, $L2_2$, $L2_1$, $L2_n$, $L2_{n-1}$, $L2_{n-2}$, and $L2_{n-3}$ may be connected to a plurality of pins $VC_{k+3}$, $VC_{k+2}$, $VC_{k+1}$, $VC_k$, $VC_{k-1}$, $VC_{k-2}$, and $VC_{k-1}$ for cell voltage sensing in the cell voltage sensing circuit 831, respectively. Further, the sensing line $L2_n$ may be connected to a pin VBN for the bus-bar 821 in the cell voltage sensing circuit 831 as well as a pin $VC_k$. Furthermore, the sensing line $L2_0$ may be connected to another pin VBP for the bus-bar 821 in the cell voltage sensing circuit 831. In this case, the sensing line $L2_0$ is not connected to the pin for cell voltage sensing.

Accordingly, the cell voltage sensing circuit 831 may measure a voltage of each battery cell based on based on a voltage difference between two adjacent corresponding sensing lines among the plurality of sensing lines $L2_3$, $L2_2$, $L2_1$, $L2_n$, $L2_{n-1}$, $L2_{n-2}$, and $L2_{n-3}$. That is, the cell voltage sensing circuit 831 may measure, as the voltage of each battery cell, a voltage between a positive electrode of the corresponding battery cell and a positive electrode of an adjacent battery cell. In some embodiments, the cell voltage sensing circuit 831 may measure a voltage of each battery cell based on a voltage difference between two adjacent corresponding pins among the plurality of pins $VC_{k+3}$, $VC_{k+2}$, $VC_{k+1}$, $VC_k$, $VC_{k-1}$, $VC_{k-2}$, and In this case, the cell voltage sensing circuit 831 measures the voltage of the first battery cell $C2_1$ of the battery module 811 based on a voltage difference between the sensing lines $L2_1$ and $L2_n$ (i.e., a voltage difference between the two pins $VC_{k+1}$ and $VC_k$). That is, since the voltage of the first battery cell $C2_1$ is measured as the voltage between the positive electrode of the battery cell $C2_1$ and the positive electrode of the adjacent battery cell (i.e., the last battery cell $C2_n$ of the battery module 812), the voltage of the first battery cell $C2_1$ may be measured as a sum of an actual voltage of the battery cell $C2_1$ and the voltage of the bus-bar 821.

Accordingly, the cell voltage sensing circuit 831 may determine the voltage of the first battery cell $C2_1$ by correcting the measured voltage of the first battery cell $C2_1$ with the voltage of the bus-bar 821. In some embodiments, the cell voltage sensing circuit 831 may determine a voltage obtained by subtracting the voltage of the bus-bar 821 from the measured voltage of the first battery cell $C2_1$ as the voltage of the first battery cell $C2_1$. In this case, the cell voltage sensing circuit 831 may measure the voltage of the bus-bar 821 based on a voltage difference between the two sensing lines $L2_0$ and $L2_n$ connected to the bus-bar 821 (i.e., a voltage difference between the two pins VBP and VBn).

In some other embodiments, unlike the embodiments described with reference to FIG. 8, a cell voltage sensing circuit 931 may measure, as a voltage of each battery cell, a voltage between a negative electrode of the corresponding battery cell and a negative electrode of an adjacent battery cell. As shown in FIG. 9, a first terminal BBP of a bus-bar 821 is connected to a sensing line $L2_0$ through the negative electrode of the battery cell $C2_1$. Further, since a second terminal BBN of the bus-bar 821 is connected to the positive electrode of the battery cell $C2_n$ which is the positive terminal of the battery module 812, the second terminal BBN of the bus-bar 821 is connected to the sensing line $L2_n$ through the positive electrode of the battery cell $C2_n$. In some embodiments, the sensing line $L2_0$ may be connected to a pin VBP for the bus-bar 821 in the cell voltage sensing circuit 931 as well as a pin $VC_k$. Further, the sensing line $L2_n$ may be connected to another pin VBN for the bus-bar 821 in the cell voltage sensing circuit 931. In this case, the sensing line $L2_n$ is not connected to the pin for sensing the cell voltage.

In this case, the cell voltage sensing circuit 931 measures the voltage of the last battery cell $C2_n$ of the battery module 812 based on a voltage difference between the sensing lines $L2_0$ and $L2_{n-1}$ (i.e., a voltage difference between the two pins $VC_k$ and $VC_{k-1}$). That is, since the voltage of the last battery cell $C2_n$ is measured as the voltage between the negative electrode of the battery cell $C2_n$ and the negative electrode of the adjacent battery cell (i.e., the first battery cell $C2_1$ of the battery module 811), the voltage of the last battery cell $C2_n$ may be measured as a sum of an actual voltage of the battery cell $C2_n$ and the voltage of the bus-bar 821.

Accordingly, the cell voltage sensing circuit 931 may determine the voltage of the last battery cell $C2_n$ by correcting the measured voltage of the last battery cell $C2_n$ with the voltage of the bus-bar 821. In some embodiments, the cell voltage sensing circuit 931 may determine a voltage obtained by subtracting the voltage of the bus-bar 821 from the measured voltage of the last battery cell $C2_n$ as the voltage of the last battery cell $C2_n$. In this case, the cell voltage sensing circuit 931 may measure the voltage of the bus-bar 821 based on a voltage difference between the two sensing lines $L2_1$ and $L2_{n-1}$ connected to the bus-bar 821 (i.e., a voltage difference between the two pins VBP and VBn).

According to the above-described embodiments, one cell voltage sensing circuit may be connected to a plurality of battery modules, and the voltage of the bus-bar included in the measured voltage of the battery cell may be compensated.

Next, a method of measuring a cell voltage in a battery apparatus according to an embodiment is described with reference to FIG. 10.

Figure 10:
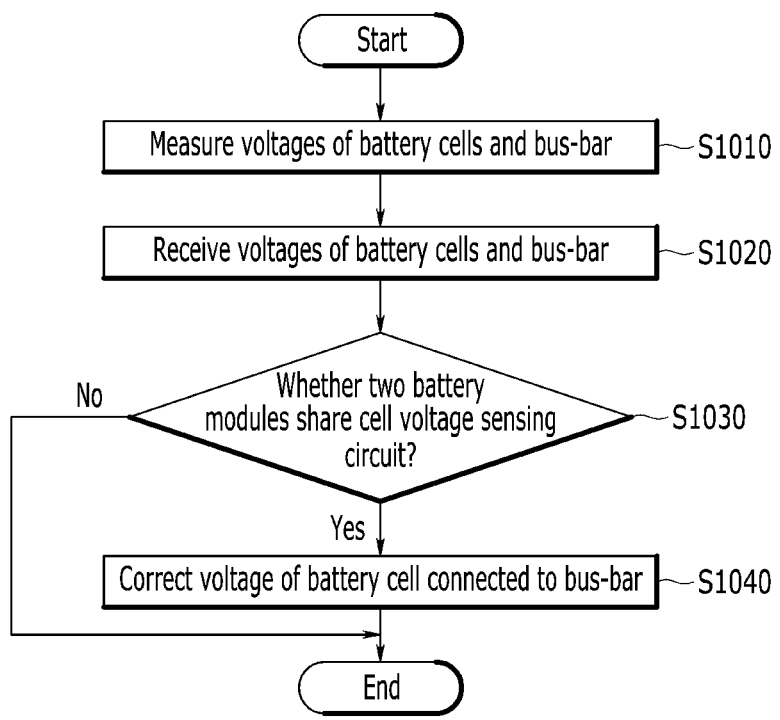
FIG. 10 is a flowchart showing a method of measuring a cell voltage in a battery apparatus according to an embodiment.

FIG. 10 is a flowchart showing a method of measuring a cell voltage in a battery apparatus according to an embodiment.

Referring to FIG. 10, a cell voltage sensing circuit of a battery management system measures voltages of battery cells of a battery module at S1010. Further, the cell voltage sensing circuit measures a voltage of a bus-bar at S1010. A processor (e.g., 140 in FIG. 1) receives the voltages of the battery cells and the voltage of the bus-bar from the cell voltage sensing circuit at S1020.

The processor 140 determines whether two battery modules share a cell voltage sensing circuit at S1030. That is, the processor 140 determines whether the voltage of the first battery cell of one battery module and the voltage of the last battery cell of another battery module are measured in the same cell voltage sensing circuit at S1030. When the two battery modules share the cell voltage sensing circuit, the processor 140 corrects the voltage of the battery cell (i.e., the first battery cell or the last battery cell) connected to the bus-bar based on the voltage of the bus-bar at S1040. In some embodiments, the processor 140 may correct the voltage of the battery cell connected to the busbar by subtracting the voltage of the busbar from the voltage of the battery cell connected to the busbar.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus comprising:
a first battery module including a first plurality of battery cells;
a second battery module including a second plurality of battery cells;
a bus-bar connecting a first electrode terminal of the first battery module and a second electrode terminal of the second battery module;
a cell voltage sensing circuit shared by a first portion of battery cells included in the first plurality of battery cells and a second portion of battery cells included in the second plurality of battery cells, and configured to measure a voltage of each battery cell included in the first and second portions of battery cells and a voltage of the bus-bar; and
a processor configured to correct a voltage of at least one battery cell among the first and second portions of battery cells based on the voltage of the bus-bar.

2. The battery apparatus of claim 1, wherein the processor is configured to correct the voltage of the at least one battery cell by subtracting the voltage of the bus-bar from the voltage of the at least one battery cell measured by the cell voltage sensing circuit.

3. The battery apparatus of claim 1, wherein the first electrode terminal is a negative terminal of the first battery module, and
wherein the at least one battery cell is among the first portion of battery cells and is connected to the negative terminal.

4. The battery apparatus of claim 1, wherein the second electrode terminal is a positive terminal of the second battery module, and
wherein the at least one battery cell is among the second portion of battery cells and is connected to the positive terminal.

5. The battery apparatus of claim 1, wherein the cell voltage sensing circuit is an integrated circuit (IC) including a plurality of pins,
wherein the first plurality of battery cells includes a first battery cell connected to the first electrode terminal,
wherein the second plurality of battery cells includes a second battery cell connected to the second electrode terminal,
wherein a first contact between the first electrode terminal and the first battery cell is connected to a first pin of the plurality of pins of the bus-bar, and a second contact between the second electrode terminal and the second battery cell is connected to a second pin of the plurality of pins of the bus-bar, and
wherein the second contact is connected to a third pin of the plurality of pins of the bus-bar for battery cell voltage sensing.

6. The battery apparatus of claim 5, wherein the at least one battery cell includes the first battery cell.

7. The battery apparatus of claim 6, wherein the first electrode terminal is a negative terminal of the first battery module,
wherein the second electrode terminal is a positive terminal of the second battery module,
wherein the first contact is a negative electrode of the first battery cell, and
wherein the second contact is a positive electrode of the second battery cell.

8. The battery apparatus of claim 6, wherein the first electrode terminal is a positive terminal of the first battery module,
wherein the second electrode terminal is a negative terminal of the second battery module,
wherein the first contact is a positive electrode of the first battery cell, and
wherein the second contact is a negative electrode of the second battery cell.

9. A method of measuring a cell voltage of a battery apparatus including a first battery module and a second battery module, the first battery module including a first plurality of battery cells, the second battery module including a second plurality of battery cells, the method comprising:
measuring, by a cell voltage sensing circuit shared by a first portion of battery cells included in the first plurality of battery cells and a second portion of battery cells included in the second plurality of battery cells, a voltage of each battery cell included in the first and second portions of battery cells;
measuring, by the cell voltage sensing circuit, a voltage of a bus-bar connecting the first battery module and the second battery module; and
correcting, by a processor, a voltage of at least one battery cell among the first and second portions of battery cells based on the voltage of the bus-bar.

10. The method of claim 9, wherein correcting the voltage of the at least one battery cell comprises correcting the voltage of the at least one battery cell by subtracting the voltage of the bus-bar from the voltage of the at least one battery cell measured by the cell voltage sensing circuit.

11. The method of claim 9, wherein the at least one battery cell for which the voltage is corrected by the processor is a battery cell sharing the cell voltage sensing circuit and connected to the bus-bar.

12. A battery apparatus comprising:
a plurality of battery modules including a first battery module and a second battery module;
a bus-bar connecting the first battery module and the second battery module;
a cell voltage sensing circuit shared by a first plurality of battery cells of the first battery module and a second plurality of battery cells of the second battery module, and configured to measure a voltage of each of the first plurality of battery cells and the second plurality of battery cells; and
a processor,
wherein the cell voltage sensing circuit includes a plurality of pins, wherein a first battery cell included in the first plurality of battery cells is connected to the bus-bar, wherein a second battery cell included in the second plurality of battery cells is connected to the bus-bar, wherein a negative electrode of the first battery cell is connected to a first pin of the plurality of pins, wherein a positive electrode of the second battery cell is connected to a second pin of plurality of pins, and wherein the processor is configured to correct a voltage of the first battery cell or a voltage of the second battery cell based on a voltage between the first pin and the second pin.

13. The battery apparatus of claim 12,
wherein a positive electrode of the first battery cell is connected to a third pin of the plurality of pins, wherein the positive electrode of the second battery cell is connected to a fourth pin of the plurality of pins, and wherein the third and fourth pins are for battery cell voltage sensing.

14. The battery apparatus of claim 13, wherein the processor is configured to measure the voltage of the first battery cell by correcting a voltage between the third pin and the fourth pin based on the voltage between the first pin and the second pin.

15. The battery apparatus of claim 12,
wherein the negative electrode of the first battery cell is connected to a third pin of the plurality of pins, wherein the negative electrode of the second battery cell is connected to a fourth pin of the plurality of pins, wherein the third and fourth pins are for battery cell voltage sensing.

16. The battery apparatus of claim 15, wherein the processor is configured to measure the voltage of the second battery cell by correcting a voltage between the third pin and the fourth pin based on the voltage between the first pin and the second pin.

17. The battery apparatus of claim 15, wherein the second plurality of battery cells is a subset of battery cells included in the second battery module,
wherein the plurality of battery modules further includes a third battery module, and
wherein the battery apparatus further comprises:
a second bus-bar connecting the second battery module and the third battery module; and
a second cell voltage sensing circuit shared by battery cells of the second battery module not included in the second plurality of battery cells and a third plurality of battery cells included in the third battery module.

* * * * *